(12) United States Patent
Myers et al.

(10) Patent No.: US 7,645,368 B2
(45) Date of Patent: Jan. 12, 2010

(54) ORIENTATION INDEPENDENT ELECTROOSMOTIC PUMP

(75) Inventors: Alan M. Myers, Menlo Park, CA (US); Juan Santiago, Fremont, CA (US); Shuhuai Yao, Stanford, CA (US); Jonathan D. Posner, Menlo Park, CA (US)

(73) Assignee: Intel Corporation, Santa Clara, CA (US)

( * ) Notice: Subject to any disclaimer, the term of this patent is extended or adjusted under 35 U.S.C. 154(b) by 999 days.

(21) Appl. No.: 11/125,720

(22) Filed: May 10, 2005

(65) Prior Publication Data

US 2006/0254913 A1  Nov. 16, 2006

(51) Int. Cl.
    *F04F 1/00* (2006.01)
(52) U.S. Cl. .......................... 204/450; 204/600; 417/41
(58) Field of Classification Search ................. 204/450, 204/600
    See application file for complete search history.

(56) References Cited

U.S. PATENT DOCUMENTS

| 7,134,486 | B2 * | 11/2006 | Santiago et al. ........ 165/104.28 |
| 2003/0062149 | A1 | 4/2003 | Goodson et al. |
| 2003/0085024 | A1 | 5/2003 | Santiago et al. |
| 2003/0164231 | A1 | 9/2003 | Goodson et al. |
| 2003/0206806 | A1 | 11/2003 | Paul et al. |
| 2004/0089442 | A1 | 5/2004 | Goodson et al. |
| 2004/0208751 | A1 | 10/2004 | Lazar et al. |
| 2004/0241004 | A1 | 12/2004 | Goodson et al. |
| 2005/0016853 | A1 | 1/2005 | Paul et al. |
| 2005/0034842 | A1 | 2/2005 | Huber et al. |

OTHER PUBLICATIONS

Yao et al. "Porous glass electroosmotic pumps: design and experiments", (2003), Journal of Colloid and Interface Science 268 pp. 143-153.*

* cited by examiner

*Primary Examiner*—Arun S Phasge
(74) *Attorney, Agent, or Firm*—Buckley, Maschoff & Talwalkar LLC (57) ABSTRACT

According to some embodiments, a method, system, and apparatus for providing an orientation independent electroosmotic pump. In some embodiments, the method includes an anode and a cathode at different electrical potentials, the anode and cathode are each sealed in an ion-exchange membrane and at least partially immersed in an electrolyte contained in a reservoir of an electroosmotic pump, collecting gases generated by electrolytic decomposition of the electrolyte within a space defined by the ion-exchange membranes that seal the anode and cathode, recombining the collected gases to produce a liquid using a catalyst, the catalyst being located outside of the reservoir, and introducing the produced liquid into the fluid reservoir through an osmotic membrane.

23 Claims, 6 Drawing Sheets

ORIENTATION INDEPENDENT ELECTROOSMOTIC PUMP

BACKGROUND

A number of devices and methods have been proposed for cooling and managing the temperature of electronic equipment, including methods that place a heat sink, a heat spreader, or a flow of cooling liquid in thermal contact with one or more components of the electronic equipment. A pump or some other active liquid flow control device may be used to pump a liquid in a heat management device or system. An electroosmotic (EO) pump may be used to pump a liquid in a heat management device or system.

However, the operation of an EO pump is typically dependent on the orientation of the pump relative to the earth's gravitational force. Accordingly, the application, efficiency, and usefulness of the EO pump may be limited.

DETAILED DESCRIPTION

The several embodiments described herein are solely for the purpose of illustration. Embodiments may include any currently or hereafter-known versions of the elements described herein. Therefore, persons in the art will recognize from this description that other embodiments may be practiced with various modifications and alterations.

Figure 1:
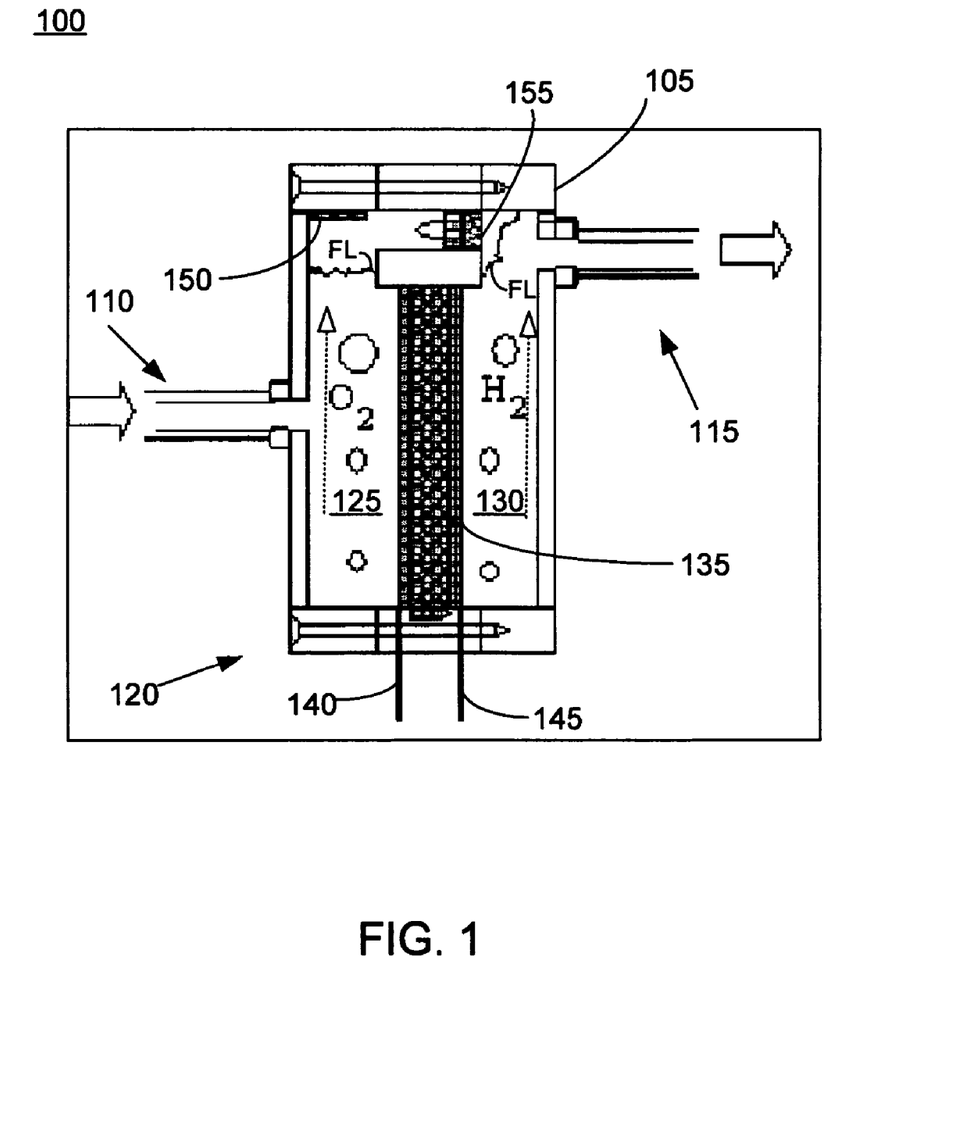
FIG. 1 illustrates a known electroosmotic (EO) pump.

FIG. 1 provides an exemplary depiction of a known EO pump, generally represented by the reference number 100. EO pump 100 may have a fluid reservoir 120 to hold electrolytic fluid therein and a recombiner 150 located above a fill line, FL, of reservoir 120 to combine gases resulting from electrolytic decomposition of the electrolytic fluid. The electrolytic fluid may be water with a low concentration of pH buffering salt such as sodium borate. Fluid reservoir 120 is also provided to contain a positively charged anode 140, a negatively charged cathode 145, and an EO pump structure 135 therein. Reservoir 120 is generally divided into an inlet reservoir 125 that is located on an inlet 110 side of EO pump 100 and an outlet reservoir 130 located on an outlet 115 side of EO pump 100.

Gases are generated by electrolytic decomposition of the electrolytic fluid in the vicinity of electrically charged anode 140 and cathode 145. Recombiner 150 is located above the fill line of reservoir 120 and acts to recombine gases resulting from the electrolytic decomposition. In the instance the electrolytic fluid is an aqueous solution, oxygen ($O_2$) and hydrogen ($H_2$) gases may be produced as a result of the electrolytic decomposition. The presence of the decomposition gases in reservoir 120 may deplete the fluid available in the EO pump 100 and decrease the performance of the EO pump 100 when gas enters the pump structure 135.

A polytetrafluoroethylene (PTFE) membrane 155 is provided to separate inlet reservoir 125 from outlet reservoir 130. PTFE membrane 155 is impermeable to the electrolytic fluid yet permeable to the electrolytic decomposition gases. PTFE membrane 155 allows the hydrogen gas (i.e., $H_2$) generated in the vicinity of cathode 145 to pass from outlet reservoir 130 to inlet reservoir 125 and mix with the oxygen gas ($O_2$) generated in the vicinity of anode 140. The hydrogen and oxygen gases recombine at recombiner 150 to form water.

The gases resulting from the electrolytic decomposition have a lower density than the electrolytic fluid. The gases generated at electrodes 140 and 145 rise, due to their lower relative density, under the influence of gravity and catalyze at recombiner 150 to form water.

Thus, the operation of EO pump 100 depends on maintaining the orientation of EO pump 100 such that recombiner 150 located in reservoir 120 is above the electrolytic pump fluid contained therein. Also, recombiner 150 ceases to recombine the decomposition gas molecules when submerged in water. Keeping recombiner 150 dry facilitates efficient operation of the recombiner.

Figure 2:
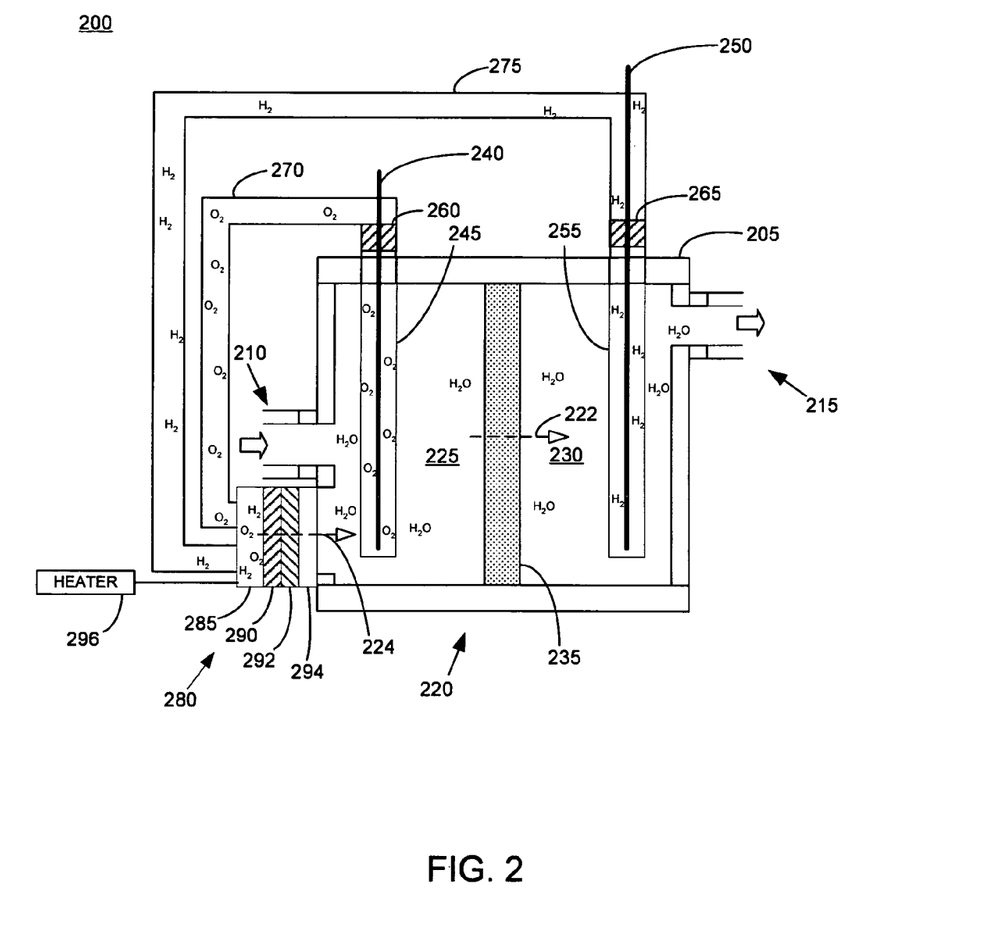
FIG. 2 illustrates an exemplary apparatus, in accordance with some embodiments hereof.

FIG. 2 is an exemplary apparatus 200 according to some embodiments hereof. Apparatus 200 includes an electroosmotic (EO) pump having a reservoir 220 defined by housing 205. Housing 205 has a fluid inlet 210 and a fluid outlet 215. Reservoir 220 includes an inlet reservoir 225 located on fluid inlet 210 side of reservoir 220 and an outlet reservoir 230 located on fluid outlet 215 side of reservoir 220. Fluid inlet 210 provides an entry point for pump fluid that is pumped by EO pump apparatus 200. Fluid outlet 215 provides an outlet for pump fluid that is pumped by EO pump system 200.

Apparatus 200 includes at least two electrodes 240 and 250. Electrodes 240, 250 may be electrically charged by a source of electrical power (not shown). The electrical power source may be a battery, voltage supply, or any other source of power compatible with various aspects and embodiments herein. In some embodiments, electrode 240 is positively charged and electrode 250 is negatively charged. Accordingly, electrode 240 may be referred to herein as an anode to denote that it is or can be positively charged. Electrode 250 may be referred to herein as a cathode to denote that it is or can be negatively charged. Anode 240 and cathode 250 may also be referred to herein, generally, as electrodes 240, 250.

Anode 240 is located on one side of an EO pumping structure 235 and cathode 250 is located on an opposing side of EO pumping structure 235. Anode 240 is located in inlet reservoir 225 that is on one side of EO pumping structure 235 and cathode 250 is located on an opposing side of EO pumping structure 235, in outlet reservoir 230. EO pumping structure 235 may include a porous structure that provides a number of micron-sized pathways therethrough.

In some embodiments, EO pumping structure 235 may feature high porosity, high electroosmotic mobility, and small diameter pores for the passage of pump fluid therethrough. In some embodiments, pumping structure 235 may include, for example, a sintered borosilcate glass frit pump or porous silicon membrane. It should be understood by those in the relevant art that other materials may be used in accordance with the various embodiments herein.

In accordance with certain principles of electrokinetics and electroosmotic flow, the external application of an electrical potential along pumping structure 235 by anode 240 and cathode 250 results in a motion (i.e., flow) of the pump fluid from anode 240 to cathode 250 in the direction of arrow 222.

The principles of electrokinetics and electroosmotic flow are understood by those in the art, thus the details thereof are not repeated herein.

In some embodiments hereof, electrodes 240, 250 are enclosed within ion-exchange membrane 245, 255, respectively. Ion-exchange membranes 245, 255 are synthetic polymers having ionic properties. In some embodiments, ion-exchange membranes 245, 255 have the properties of being selectively and highly permeable to water, a cation exchange polymer, impermeable to gas when hydrated, extremely resistant to chemical degradation, and having a relatively high working temperature (e.g., about 190° C.). Accordingly, as will be better understood following the detailed discussion of the operation of apparatus 200 below, ion-exchange membranes 245, 255 that enclose electrodes 240, 250 facilitate the active pumping of the electrolyte therethrough.

In some embodiments, apparatus 200 includes a recombination device 280. Recombination device 280 is provided to combine gases that result from electrolytic decomposition of the electrolyte in the vicinity of electrodes 240, 250 into a liquid and to return the liquid produced thereby to reservoir 220. In some embodiments, the gases are routed from a vicinity of electrodes 240, 250 to recombination device 280 via conduits 270, 275.

In some embodiments, conduits 270, 275 may be made of the same or a similar ion-exchange membrane as ion-exchange membranes 245, 255. In some embodiments, conduits 270, 275 may be made of a metal, plastic, or other materials to contain and route gases therethrough from the vicinity of electrodes 240, 250 to recombination device 280. It should be understood by those in the relevant art that conduits 270, 275 should be able to withstand the operational pressures, temperatures, and chemicals intended to be contained and routed therethrough.

In some embodiments, recombination device 280 includes at least three layers of structure (e.g., a fabric, a web, a material, a chamber, etc.). Each of the three layers of structure are preferably positioned with a surface thereof in substantial contact with a surface of another of the three layers of structure, as depicted in FIG. 2. In some embodiments, recombination device 280 includes a polytetrafluoroethylene (PTFE) barrier 290, a catalyst 292, and an osmotic membrane 294.

One function of recombination device 280 is to recombine the gases generated by the electrolytic decomposition of the electrolyte in the vicinity of charged electrodes 240, 250. In some embodiments, a catalytic recombiner is used to recombine the gases generated by the electrolytic decomposition. A function of catalyst 292 is to initiate and accelerate the recombination of the gases introduced to recombination device 280 into a liquid such as, for example, water.

In some embodiments, catalyst 292 is a porous coated platinum (Pt). The Pt catalyst may be effective to recombine the electrolytic decomposition gases (e.g., hydrogen and oxygen) to produce water. The particular type of recombiner, catalytic or otherwise, may be varied, substituted, or modified such that it is compatible with the electrolyte, the generated gases, and other aspects of the present disclosure.

In some embodiments hereof, osmotic membrane 294 is provided to transport the liquid produced by catalyst 292 to reservoir 220. Osmotic membrane 294 may be permeable to the produced liquid. The water produced at catalyst 292 diffuses across osmotic membrane 294 to reservoir 220 under the influence of osmotic pressure differences present on either side of osmotic membrane 294. The osmotic pressure differences arise as a result of a difference in ion concentration on each side of membrane 294.

Figure 3:
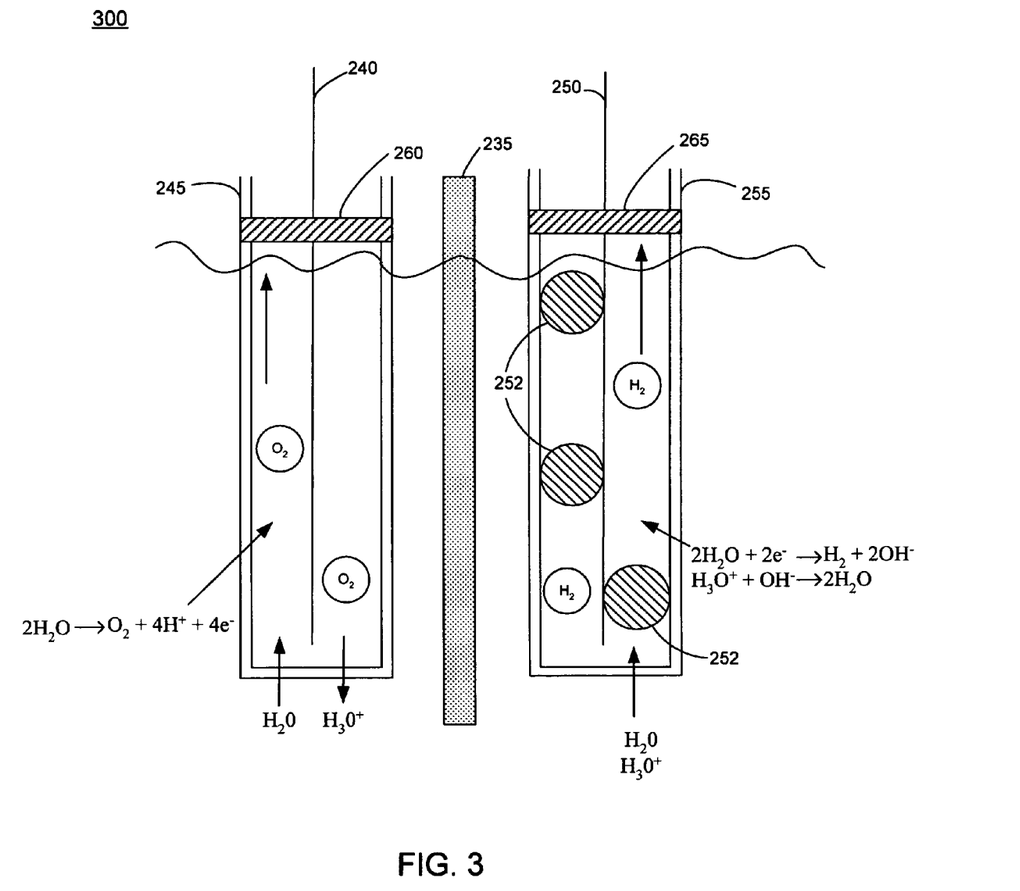
FIG. 3 is a depiction of an exemplary electrolytic decomposition process of electrolytic fluid, according to some embodiments hereof.
Figure 4:
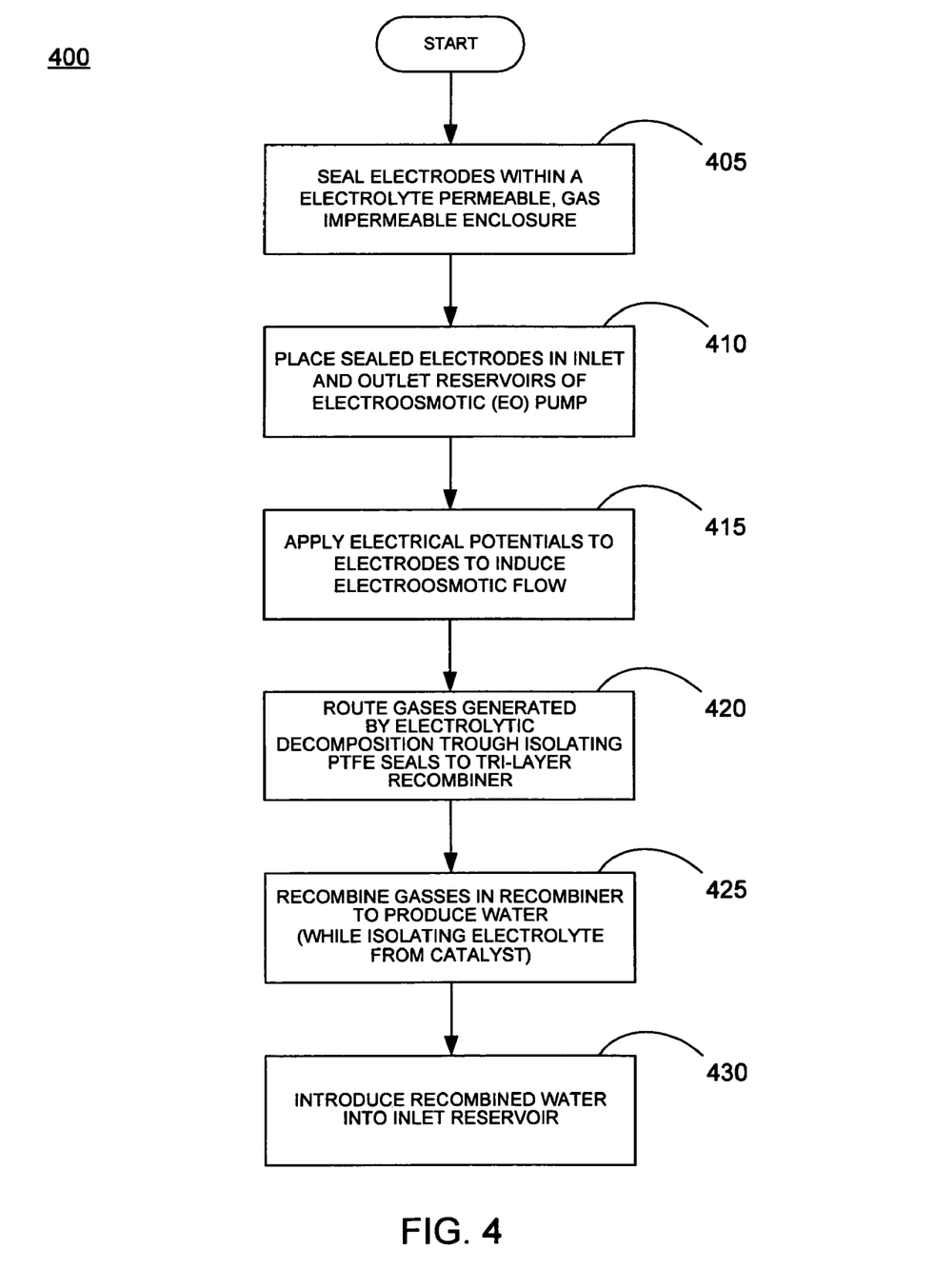
FIG. 4 is an exemplary flow diagram of a method according to some embodiments hereof.

The operation of EO pump apparatus 200 will now be discussed with reference to FIGS. 2 through 4. FIG. 3 provides an exemplary depiction of an electrolytic decomposition process 300 that occurs in the vicinity of electrodes 240, 250, according to some embodiments hereof. FIG. 4 is an exemplary flow diagram of a method 400 according to some embodiments hereof.

At an initial operation 405 of process 400, electrodes 240 and 250 are sealed or enclosed within ion-exchange membranes 245 and 255, respectively. Ion-exchange membranes 245, 255 may include a tube, a sleeve, sheets, or other configurations of an ion-exchange membrane material in which electrodes 240, 250 are enclosed. Ion-exchange membranes 245, 255 are sealed to define a space therein for containing electrodes 240, 250 and a volume of electrolyte. An epoxy, adhesive, or other sealing mechanism may be used to seal a joint or seam (if any) of ion-exchange membranes 245, 255. The epoxy, adhesive, or other sealing mechanism may be impenetrable to both a liquid (i.e., the electrolyte) and a gas.

At 410, sealed electrodes 240, 250 are placed in inlet reservoir 225 and outlet reservoir 230, respectively. Reservoir 220 contains electrolyte therein. In some embodiments, the electrolyte is an aqueous buffered solution such as, for example, buffered water. As used herein, the electrolyte is water or a solvent capable of dissolving ions.

Ion-exchange membranes 245, 255 are permeable to water and positive ions (i.e., cations). Accordingly, in the instance the aqueous solution is buffered water, the buffered water diffuses through ion-exchange membranes 245, 255.

At 415 of process 400, electrodes 240, 250 are maintained at different electrical potentials to induce an electroosmotic flow through electroosmotic structure 235. In some embodiments, a consequence of the applied electrical potentials at electrodes 240, 250 is a chemical reaction in the vicinity of electrodes 240, 250. The chemical reaction, referred to as electrolytic decomposition, occurs in response to Faradaic current flux between the electrically charged electrodes 240, 250 and the electrolyte.

FIG. 3 provides an illustrative depiction of the chemical reaction that occurs in the vicinity of electrodes 240, 250. As shown, oxygen gas is produced in the vicinity of anode 240 and hydrogen gas is produced in the vicinity of cathode 250, as a result of the electrolytic decomposition. Ion-exchange membranes 245, 255 are impermeable to gas when hydrated. Ion-exchange membranes 245, 255 are hydrated by the electrolyte when the sealed electrodes 240, 250 are immersed or placed in the electrolyte, as discussed above with reference to operation 410. Thus, the gases produced in the vicinity of anode 240 and cathode 250 are contained within hydrated ion-exchange membranes 245, 255, respectively.

In some embodiments, measures may be taken to prevent electrodes 240 and 250 from contacting ion exchange membranes 245 and 255, respectively. It may be desirable to isolate electrodes 240 and 250 from ion-exchange membranes 245 and 255 since the ion-exchange membranes may by conductive to electrons. In some embodiments, a double layer or sheathing of ion exchange membrane 245 is provided at anode 240. Further, at cathode 250 a series of spacers 252 may be provided on electrode 250 (e.g., a platinum wire) in addition to the double layer of ion exchange membrane 255. Spacers 252 may be formed by placing epoxy on cathode 250 inside of the ion exchange membrane closet to the cathode. The spacers (e.g., epoxy balls) may be spaced apart approximately every 5 mm along cathode 250.

The space defined by ion-exchange membranes 245, 255 between the ion-exchange membrane and electrodes 240, 250 acts to contain and isolate the electrolytic decomposition gases formed in the vicinity of the electrodes from reservoir 220 by preventing the gases from entering reservoir 220. Thus, the electrolytic decomposition generated gases are removed from the volume of pumping fluid in inlet reservoir 225 and outlet reservoir 230.

In some embodiments, PTFE membranes 260, 265 may be used to seal an opening to ion-exchange membranes 245, 255, respectively. PTFE membranes 260, 265 are impermeable to the electrolyte (e.g., water), yet permeable to gases such as electrolytic decomposition generated gases hydrogen and oxygen. Accordingly, PTFE membranes 260, 265 allow the electrolytic decomposition gas molecules to pass therethrough and inhibit the passage of the electrolyte from the space defined by ion-exchange membranes 245, 255, between the ion-exchange membranes and electrodes 240, 250.

The generation and containment of gases within the space defined by ion-exchange membranes 245, 255 results in an increase in pressure within the defined space as the volume of the electrolytic decomposition gases within the space increases. As the pressure within the space defined by ion-exchange membranes 245, 255 increases, the electrolytic decomposition generated gases are forced through gas permeable PTFE membranes 260, 265.

The pressure of the gases contained within the space defined by ion-exchange membranes 245, 255 forces the gases through PTFE membranes 260, 265, notwithstanding the orientation of apparatus 200. PTFE membranes 260, 265 provide an outlet for the gas contained in the ion-exchange membrane defined space.

In some embodiments, the electrolytic decomposition gases are routed through conduits 270, 275 from the vicinity of electrodes 240, 250 to recombination device 280. This operational aspect of apparatus 200 is expressed at operation 420 in process 400.

At operation 425, the electrolytic decomposition gases routed from the vicinity of electrodes 240, 250 are introduced to recombination device 280 where they are recombined to produce a liquid. In some embodiments, gas chamber 285 provides a collection area or chamber to contain the electrolytic decomposition gases routed from the vicinity of electrodes 240, 250. In some embodiments, gas chamber 285 is in fluid communication with PTFE barrier or layer 290.

PTFE layer 290 is provided to inhibit the liquid produced by recombination device 280 from re-entering gas chamber 285 or conduits 270, 275. In some embodiments, PTFE barrier 290 is operative to provide a barrier to keep liquid water from re-entering gas chamber 285, conduits 270, 275, or the space defined by ion-exchange membrane 245, 255 irrespective of the orientation of apparatus 200. That is, the water-blocking ability (i.e., physical properties) of PTFE barrier 290 is not dependent on the orientation system 200.

PTFE barrier 290 is in further contact or communication with catalyst 292. Catalyst 292, in some embodiments, includes porous platinum coated in Teflon. Catalyst 292 is provided to initiate, accelerate, and recombine the gases collected from the vicinity of electrodes 240, 250 into water.

In some embodiments, the liquid produced at catalyst 292 is introduced to reservoir 220 through osmotic membrane 294, as illustrated at operation 430 of process 400. Osmotic membrane 294 is provided to allow passage of the liquid produced by recombination device 280 into reservoir 220. The liquid produced by recombination device 280 has a relatively low ion density compared to the electrolyte in reservoir 220. The difference in ion density between the produced liquid on catalyst 292 side of osmotic barrier 294 and the relatively high ion density region of the electrolyte on reservoir 220 side of osmotic membrane 294 creates osmotic pressure at osmotic membrane 294. An example of an electrolyte suitable for use with apparatus 200 and process 400 includes borate buffer, at a concentration of 1 mM.

According to some embodiments hereof, a heater 296 may be provided to heat recombination device 280, as illustrated in FIG. 2. Heater 296 may surround or otherwise be in thermal contact or communication with recombination device 280 to regulate a temperature of recombination device 280. In some embodiments, the heating of recombination device 280 tends to increase the temperature of recombination device 280, increase the efficiency of the chemical reactions provided by recombination device 280, restore functionality to surfaces of recombination device 280 that may be inadvertently exposed to a liquid and prevent water condensation on cool surfaces.

Heater 296 may be controlled to activate in the instance recombination device decreases below a threshold temperature, above a measured pressure, or when condensate is present. In some embodiments, a threshold condition may be predetermined or selectively set according to one or more criteria. The one or more criteria may include, for example, an ambient operating temperature, a temperature of the electrolyte, the chemical characteristics of the electrolyte, a desired operating temperature, a desired operating efficiency, etc. The criteria may also include, for example, a high level of condensate at the recombiner 280 as measured by a capacitive sensor.

In some embodiments, apparatus 200 is operated in a closed loop system. That is, the electrolyte in reservoir 220 is pumped from fluid inlet 210, through EO pumping structure 235, out of fluid outlet 215, and returned to fluid inlet 210. Due to the closed nature of the closed loop system, the pump fluid that is pumped out of fluid outlet 215 is returned to fluid inlet 210. In some embodiments, the pump fluid may be routed to, over, through, or otherwise placed in thermal contact or communication with a thermal interface or surface of a device (not shown) to cool the surface of the device. After the pump fluid is routed into thermal contact with the surface of the device the pump fluid is returned to EO pump system 200 at fluid inlet 210. In some embodiments herein, the pump fluid may be routed through a radiator (or other heat management device) to facilitate removal or dissipation of heat from the pump fluid.

It should be appreciated by those in the relevant art that the electrodes herein may be implemented in various shapes, sizes, and arrangements. For example, in some embodiments hereof, at least a portion of an electrode may be shaped in the form of a spiral (not shown) in order to facilitate a more uniform electric field across pumping structure 235.

Figure 5A:
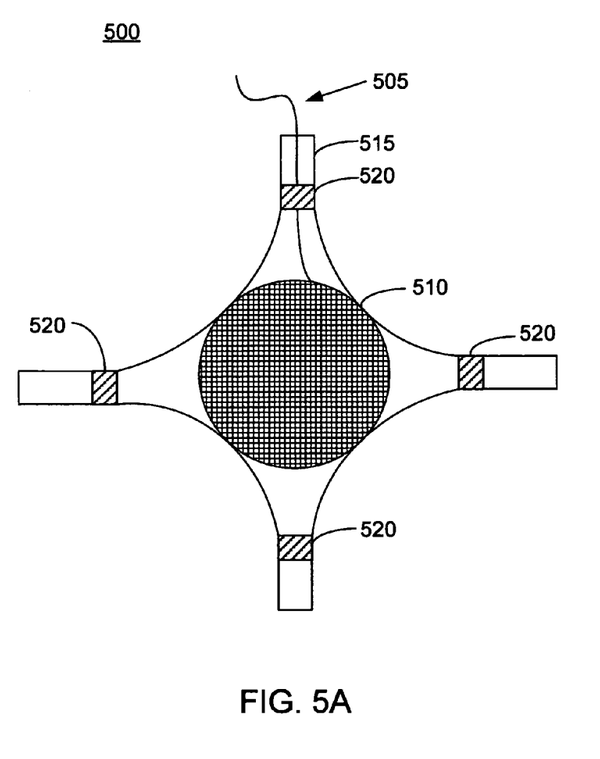
FIGS. 5A and 5B illustrate an exemplary ion-exchange membrane and electrode arrangement, according to some embodiments hereof.
Figure 5B:
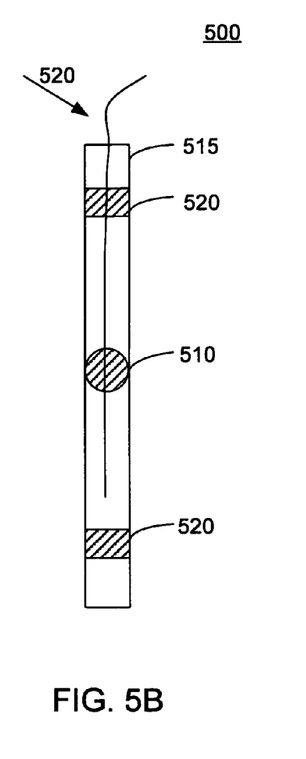

FIGS. 5A and 5B illustrate yet another exemplary electrode arrangement. In some embodiments hereof, electrode arrangement 500 includes an electrode 505 and an ion-exchange membrane 515. FIG. 5A is a front elevation view of electrode arrangement 500 and FIG. 5B is a side elevation view thereof. As shown, electrode arrangement 500 has four exit sleeves that extend radially from a central portion of electrode arrangement 500. Each of the four exit sleeves has a PTFE membrane 520 located at a distal end thereof. Ion-exchange membrane 515 and PTFE membranes 520 act to contain and channel electrolytic decomposition gases therein, in a manner similar to ion-exchange membranes 245, 255 discussed above with regard to FIG. 2. In some embodiments, a portion of electrode 505 may be shaped in the form of a mesh 510 to increase area directly electrically charged by electrode 505 within the space defined by ion-exchange membrane 515.

Each of the four exit sleeves may be connected to a recombination device (e.g., recombination device 280) to transport electrolytic decomposition gases contained within electrode arrangement 500 to the recombination device, in accordance with other aspects hereof. Electrode 505 may be routed through one or more of PTFE barriers 520 to a power source (not shown) that supplies an electrical charge to electrode 505. It should be understood that one or more of electrode arrangements 500 may be used in some embodiments hereof.

While the pressure of the generated electrolytic decomposition gases, and not buoyant and/or gravitational forces, may primarily force the generated gases through the PTFE barriers (e.g., 260, 265, 520) in the various embodiments hereof, the electrode arrangement 500 may aid in the transport of the generated gases from the space defined by ion-exchange membrane 515 through the PTFE seal to, for example, a recombination device.

Figure 6:
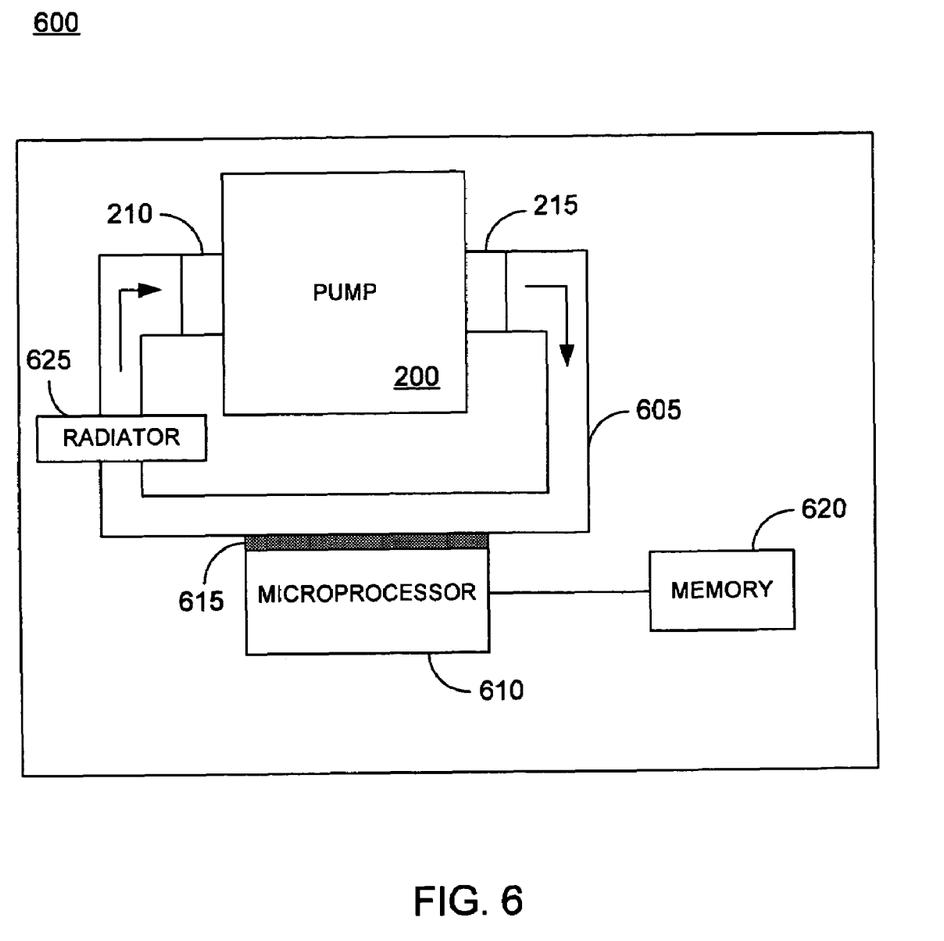
FIG. 6 is a block diagram of a system according to some embodiments hereof.

FIG. 6 is a block diagram of a system 600 according to some embodiments hereof. System 600 may comprise components of a desktop computing platform. System 600 includes pump 200, conduit 605, a microprocessor 610, a thermal interface 615, a memory 620 and a radiator 625. Those in the art should appreciate that system 600 may include additional, fewer, or alternative components to microprocessor 610 and memory 620. Memory 620 may comprise any type of memory for storing data, including but not limited to a Single Data Rate Random Access Memory, a Double Data Rate Random Access Memory, or a Programmable Read Only Memory.

In operation, the electrolyte in pump 200 is pumped from fluid inlet 210, through the EO pumping structure of pump 200 (shown in FIG. 2), out of fluid outlet 215, and returned to fluid inlet 210 through conduit 605. Due to the closed configuration of pump 200 and conduit 605, the pump fluid that is pumped out of fluid outlet 215 is returned to fluid inlet 210. Thermal interface 615 is in thermal communication with microprocessor 610. In some embodiments, thermal interface 615 is a surface of microprocessor 610. The pump fluid is placed in thermal contact or communication, through conduit 605, with thermal interface 615 to dissipate the heat generated by microprocessor 610. After the pump fluid is routed into thermal contact with thermal interface 615, the pump fluid is returned to pump 200 at fluid inlet 210.

In some embodiments, as shown in FIG. 6, after the pump fluid is routed into thermal contact with thermal interface 615 the pump fluid is routed through an external radiator 625 (or other heat management device) to dissipate the heat in the fluid. The pump fluid is returned to pump 200 at fluid inlet 210 after it passes through radiator 625.

Accordingly, in accordance with some embodiments hereof, a multi-layered recombination device, system, and methods for an orientation independent EO pump have been discussed in which the operation of the EO pump is independent of an orientation of the EO pump. Gases generated by the EO pump are removed from the volume of electrolyte pumped by the EO pump, which, according to some embodiments, reduces a need to locate the recombination device in the reservoir. Removing the generated electrolytic decomposition gases from the pump fluid may increase the operating efficiency of the pump.

The several embodiments described herein are solely for the purpose of illustration. Persons in the art will recognize from this description other embodiments may be practiced with modifications and alterations, limited only by the claims.

What is claimed is:

1. A method, comprising:
applying a difference in electrical potential to an anode and a cathode, the anode and cathode are each in an ion-exchange membrane sealed by a barrier that inhibits passage of an electrolyte and at least partially immersed in the electrolyte contained in a fluid reservoir of an electroosmotic pump;

collecting gases generated at least in part by electrolytic decomposition of the electrolyte within a space defined by the ion-exchange membranes that seal the anode and cathode;

channeling the generated gases through conduits from the space defined by the sealed ion-exchange membranes through the barrier to a gas recombiner located outside of the fluid reservoir independent of the orientation of reservoir and under pressure of the generated gases;

recombining the collected gases to produce a liquid by the gas recombiner, the gas recombiner including a catalyst and an osmotic membrane; and introducing the produced liquid into the fluid reservoir through an osmotic membrane.

2. The method of claim 1, wherein the barrier is permeable to gas and impermeable to the electrolyte.

3. The method of claim 1, wherein the barrier comprises polytetrafluoroethylene (PTFE).

4. The method of claim 1, further comprising heating the catalyst.

5. The method of claim 1, wherein the generated gases are hydrogen and oxygen.

6. The method of claim 1, wherein the produced liquid is water.

7. The method of claim 1, further comprising sealing each of the anode and the cathode in a tube of the ion-exchange membrane or in between sheets of the ion-exchange membrane.

8. The method of claim 1, wherein the ion-exchange membranes, when hydrated, are permeable to a liquid and ions and impermeable to the generated gases.

9. The method of claim 1, further comprising maintaining an inlet portion of the reservoir at a lower pressure than an outlet pressure of the fluid reservoir.

10. An apparatus comprising:
a first electrode enclosed in a first ion-exchange membrane;

a first barrier to seal the first electrode within a first space defined by the first ion-exchange membrane and first barrier and to inhibit passage of an electrolyte from the first space;

a second electrode enclosed in a second ion-exchange membrane;

a second barrier to seal the second electrode within a second space defined by the second ion-exchange membrane and second barrier and to inhibit passage of the electrolyte from the second space;

an electroosmotic pump reservoir to contain the electrolyte, a portion of the enclosed first electrode, and a portion of the enclosed second electrode in the electrolyte;

a recombination device to recombine gases to produce a liquid, wherein the recombination device is located outside of the reservoir and includes a catalyst and an osmotic membrane; and conduits to channel gases generated by electrolytic decomposition of the electrolyte in the first and second spaces defined by the first and second ion-exchange membranes from the first and second spaces through the first and second barriers to a recombination device located outside of the fluid reservoir independent of the orientation of reservoir and under pressure of the generated gases.

11. The apparatus of claim 10, wherein the ion-exchange membranes are permeable to a liquid and ions, and impermeable to gas when hydrated.

12. The apparatus of claim 10, wherein the barrier inhibits passage of the electrolyte from exiting the defined first and second spaces.

13. The apparatus of claim 10, wherein the barrier comprises polytetrafluoroethylene (PTFE).

14. The apparatus of claim 10, wherein the produced liquid is water.

15. The apparatus of claim 10, wherein the generated gases are hydrogen and oxygen.

16. The apparatus of claim 10, further comprising a fluid inlet to the reservoir and a fluid outlet out of the reservoir.

17. The apparatus of claim 10, wherein the recombination device comprises:
 a polytetrafluoroethylene (PTFE) barrier to inhibit the passage of the produced liquid from the recombination device;
 a catalyst to initiate a recombination of the generated gases to the liquid;
 an osmotic membrane to transport the produced liquid from the recombination device to the reservoir, and
 a heater to improve a rate of recombination of catalyst and inhibit condensation.

18. The apparatus of claim 17, wherein the catalyst includes porous platinum.

19. The apparatus of claim 17, wherein the recombination device further comprises a chamber to collect the generated gases.

20. The apparatus of claim 10, further comprising an electroosmotic pumping structure located in the reservoir between the first and the second electrodes.

21. A recombination device to recombine gases, the recombination device comprising:
 a polytetrafluoroethylene (PTFE) barrier, wherein the PTFE barrier is provided to inhibit passage of a liquid produced by the recombination therethrough from the recombination device;
 a catalyst to initiate a recombination of gases to produce the liquid, wherein the catalyst is interfaced with the PTFE barrier; and
 an osmotic membrane interfaced with the catalyst to transport the produced liquid from the catalyst to an outlet of the recombination device.

22. The recombination device of claim 21, wherein the catalyst comprises porous platinum.

23. The recombination device of claim 21, further comprising a chamber in fluid communication with the PTFE barrier to collect the gases therein.

* * * * *

UNITED STATES PATENT AND TRADEMARK OFFICE
CERTIFICATE OF CORRECTION

PATENT NO. : 7,645,368 B2　　　　　　　　　　　　　　　　　　　　　Page 1 of 1
APPLICATION NO. : 11/125720
DATED : January 12, 2010
INVENTOR(S) : Myers et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1282 days.

Signed and Sealed this

Sixteenth Day of November, 2010

David J. Kappos
*Director of the United States Patent and Trademark Office*